US008154563B2

(12) United States Patent
Park et al.

(10) Patent No.: US 8,154,563 B2
(45) Date of Patent: Apr. 10, 2012

(54) COLOR CONVERSION METHOD AND APPARATUS FOR DISPLAY DEVICE

(75) Inventors: Ju-yong Park, Seoul (KR); Du-sik Park, Suwon-si (KR); Yun-tae Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 903 days.

(21) Appl. No.: 12/081,986

(22) Filed: Apr. 24, 2008

(65) Prior Publication Data

US 2009/0122075 A1 May 14, 2009

(30) Foreign Application Priority Data

Nov. 12, 2007 (KR) ........................ 10-2007-0115122

(51) Int. Cl.

| | |
|---|---|
| ***G09G 5/00*** | (2006.01) |
| ***G09G 5/02*** | (2006.01) |
| ***H04N 9/64*** | (2006.01) |
| ***H04N 5/202*** | (2006.01) |
| ***H04N 1/46*** | (2006.01) |
| ***G03F 3/08*** | (2006.01) |
| ***G06K 9/40*** | (2006.01) |
| *H04N 5/46* | (2006.01) |
| *G06K 9/00* | (2006.01) |
| *G06K 9/32* | (2006.01) |

(52) U.S. Cl. ........ 345/602; 345/589; 345/600; 345/606; 345/549; 348/254; 348/256; 348/557; 348/674; 358/518; 358/519; 358/523; 358/525; 382/167; 382/254; 382/274; 382/300

(58) Field of Classification Search .................. 345/428, 345/581, 586, 589–591, 597, 643, 600–602, 345/606, 549; 348/251–254, 256, 353, 557, 348/560, 645, 649; 358/518–519, 523–525; 382/162–167, 254, 274, 276, 300
See application file for complete search history.

(56) References Cited

U.S. PATENT DOCUMENTS

| | | | | |
|---|---|---|---|---|
| 5,067,019 | A * | 11/1991 | Juday et al. | 348/580 |
| 6,064,775 | A * | 5/2000 | Suzuki et al. | 382/254 |
| 2002/0029715 | A1* | 3/2002 | Ogatsu et al. | 101/494 |
| 2004/0161147 | A1* | 8/2004 | Takahashi | 382/167 |
| 2007/0126661 | A1 | 6/2007 | Kao et al. | |
| 2007/0252837 | A1* | 11/2007 | Demandolx | 345/441 |
| 2009/0122075 | A1* | 5/2009 | Park et al. | 345/602 |

FOREIGN PATENT DOCUMENTS

| | | |
|---|---|---|
| JP | 2000-253263 | 9/2000 |
| JP | 2005-128254 | 5/2005 |
| KR | 2005-49008 | 5/2005 |
| KR | 2005-97091 | 10/2005 |
| KR | 2005-105643 | 11/2005 |

* cited by examiner

*Primary Examiner* — Wesner Sajous
(74) *Attorney, Agent, or Firm* — Staas & Halsey LLP

(57) ABSTRACT

A color conversion method and apparatus for a multi-primary display (MPD) are provided with analyzing an input image to determine a transformation parameter; interpolating at least two look-up tables for color conversion according to the transformation parameter, in order to calculate a look-up table for the input image; and applying the calculated look-up table to the input image to perform the color conversion. Accordingly, it is possible to provide good color reproduction and efficiently use a color gamut of an MPD having color coordinates that are different from those of primaries of an input image.

27 Claims, 6 Drawing Sheets
(2 of 6 Drawing Sheet(s) Filed in Color)

COLOR CONVERSION METHOD AND APPARATUS FOR DISPLAY DEVICE

CROSS-REFERENCE TO RELATED APPLICATION

This application claims the benefit of Korean Application No. 2007-115122, filed Nov. 12, 2007 in the Korean Intellectual Property Office, the disclosure of which is incorporated herein by reference.

BACKGROUND OF THE INVENTION

1. Field of the Invention

Aspects of the present invention relate to a display device, and more particularly, to a color conversion method and apparatus for a multi-primary display (MPD).

2. Description of the Related Art

In general, display devices display images using three primaries (e.g., primary colors, such as, Red, Green, and Blue). Recently, trials have been conducted with display devices that can reproduce an expanded color gamut of four or more primaries.

A display device that expands a color gamut using four or more primaries so as to have a wider gamut than a Red-Green-Blue (RGB) display device that uses three primaries is called a Multi-Primary Display (MPD). In order to expand a color gamut, a method of converting color data of an existing RGB display device into color data of a Red-Green-Blue-White (RGBW) display device, in which a new primary White (W) is added, is generally used.

The MPD uses extracts or determines a value of the new primary W on the basis of RGB values. However, since the method theoretically excludes a probability of representing an RGB combination as two or more RGBW combinations, the method cannot sufficiently utilize redundancy caused by an increase in the number of primaries.

Also, when color coordinate values of RGBW primaries are different from color coordinate values of RGB primaries, a correction must be performed to match the color coordinate values of the RGBW primaries to the color coordinate values of the RGB primaries.

SUMMARY OF THE INVENTION

Several aspects and example embodiments of the present invention provide an effective color conversion method and apparatus that can enhance color reproduction and make efficient use of a color gamut by performing color conversion using a transformation parameter based on chroma values of an input image, in a multi-primary display (MPD) having color coordinate values that are different from the coordinate values of primary colors of the input image.

In accordance with an example embodiment of the present invention, there is provided a color conversion method for a display, including: analyzing an input image to determine a transformation parameter; interpolating at least two look-up tables for color conversion according to the transformation parameter, in order to calculate a look-up table for the input image; and applying the calculated look-up table to the input image to perform the color conversion.

According to an aspect of the present invention, the analyzing of the input image includes: analyzing a chroma component of the input image to obtain a ratio of a high chroma region with respect to the input image and/or a ratio of a low chroma region with respect to the input image; and calculating the transformation parameter according to the ratio of the high chroma region and/or the ratio of the low chroma region.

According to another aspect of the present invention, the at least two look-up tables includes a first look-up table configured to reproduce colors most similar to colors that are capable of being reproduced by a target display, and a second look-up table configured to reproduce an entire color gamut that is capable of being reproduced by a multi-primary display, and the interpolating of the at least two look-up tables includes interpolating the at least two look-up tables according to the transformation parameter such that a use ratio of the first look-up table for the input image increases if a ratio of a high chroma region is greater than a predetermined amount, and a use ratio of the second look-up table for the input image increases if a ratio of a low chroma region is greater than a predetermined amount.

According to an aspect of the present invention, the color conversion method further includes adjusting a brightness of the input image according to the transformation parameter.

According to another aspect of the present invention, the adjusting of the brightness of the input image includes increasing the brightness of the input image by a first predetermined amount using the transformation parameter when the calculated look-up table is similar to the first look-up table, and increasing the brightness of the input image by a second predetermined amount, less than the first predetermined amount, using the transformation parameter when the calculated look-up table is similar to the second look-up table.

In accordance with another example embodiment of the present invention, there is provided a color conversion apparatus for a display, including: a parameter determining unit to analyze an input image, and to determine a transformation parameter according to the analysis; a look-up table calculating unit to interpolate at least two look-up tables for color conversion according to the transformation parameter, in order to calculate a look-up table for the input image; and a look-up table applying unit to apply the calculated look-up table to the input image in order to perform the color conversion.

According to an aspect of the present invention, the color conversion apparatus may further include a brightness adjusting unit to adjust a brightness of the input image according to the transformation parameter.

Additional aspects and/or advantages of the invention will be set forth in part in the description which follows and, in part, will be obvious from the description, or may be learned by practice of the invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The abovementioned and/or other aspects and advantages of the invention will become apparent and more readily appreciated from the following description of the embodiments, taken in conjunction with the accompanying drawings of which.

DETAILED DESCRIPTION OF EMBODIMENTS

Figure 1:
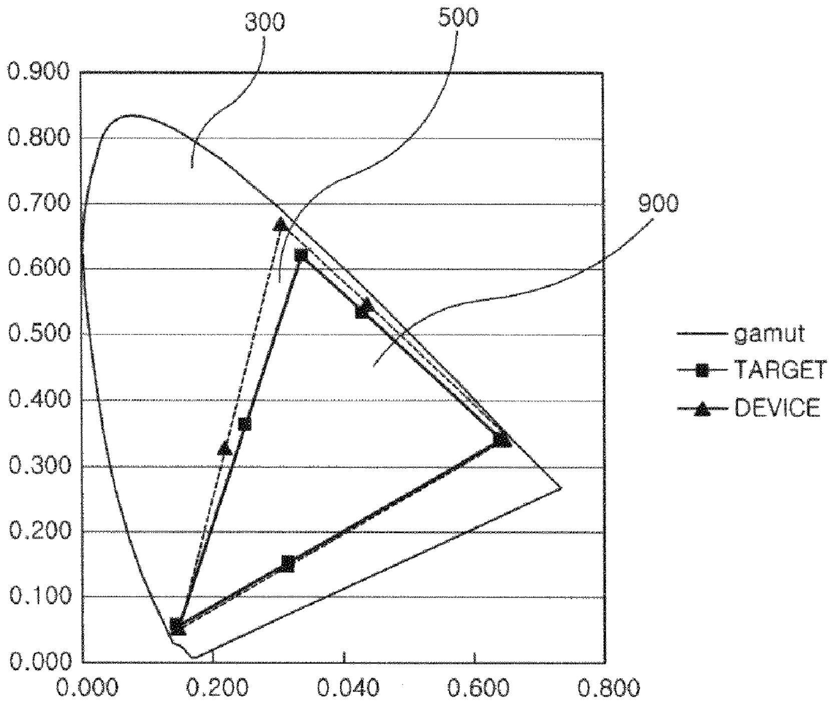
FIG. 1 is a graph to explain a color gamut of a Multi-Primary Display (MPD)

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Aspects of the present invention provide a method and apparatus for converting existing Red-Green-Blue (RGB) data into color data that is suitable for a Multi-Primary Display (MPD). According to an example embodiment of the present invention, primaries of existing RGB data can be represented by linear combinations of three-dimensional vectors corresponding to primaries of an MPD. The three-dimensional vectors may be XYZ vectors or CIELAB vectors. In this case, redundancy may result since a three-dimensional vector is represented by a linear combination of four or more three-dimensional vectors. A color vector combination from which a distance to a target color vector that is to be represented is minimized is selected from among a plurality of selectable three-dimensional color vectors. Therefore, each primary can be reproduced by a color that is reproducible by the MPD and is most similar to the primary.

Also, according to an example embodiment of the present invention, color conversion can be performed by providing a three-dimensional vector value corresponding to an arbitrary color. Accordingly, display devices using different numbers of primaries and different color coordinate values can simultaneously perform data conversion. For example, a multi-primary combination that represents a color coordinate value desired by a user (such as adobe RGB or sRGB) can be obtained.

By using the color conversion method described above, a color corresponding to an arbitrary RGB combination can be represented by a multi-primary combination. Moreover, a color conversion system based on a look-up table (LUT) can be established by converting each node (i.e., each color coordinate) using the color conversion method using the LUT. Accordingly, the colors of an existing RGB display can be reproduced by an MPD.

Meanwhile, an MPD can achieve greater quality in chroma and/or brightness than existing displays. In order to do so, a maximum range that can be reproduced by an MPD is set to the range of a color conversion function.

However, in MPDs that are generally aimed at increasing brightness, the color conversion method may deteriorate the chroma values of unmixed colors. This is because the size of a region that each primary occupies is reduced and, as a result, brightness is reduced as the number of primaries increases. The reduction of brightness can be compensated for by adding a new primary (for example, white (W)). However, in the case of unmixed colors, when the brightness is compensated for by adding a primary, the chroma is reduced.

In order to resolve the problem, aspects of the present invention propose a method of maintaining brightness by increasing lightness when the colors of an RGB display are reproduced by an MPD using the above-described color conversion method. That is, by combining a plurality of mapping methods to properly increase the lightness of a screen, it is possible to achieve the advantages of an MPD while maintaining an original brightness ratio of the screen, thus providing good color reproduction.

FIG. 1 is a view to explain a color gamut of an MPD. Referring to FIG. 1, a first area 300 represents a color gamut that can be recognized by humans, a second area 400 represents a color gamut (a target color gamut) of an existing RGB display, and a third area 500 represents a color gamut of an MPD.

As illustrated in FIG. 1, the MPD has a color gamut 500 that is wider than the color gamut 400 of the existing RGB display. That is, since the color gamut 500 of the MPD is not equal to the color gamut 400 of the existing RGB display, the entire color gamut 500 of the MPD cannot be efficiently used when normal color data is input without any conversion to the MPD.

Accordingly, in order to efficiently use the expanded color gamut 500 of the MPD, a color conversion process for converting an input RGB color signal so as to match a color gamut 400 of the input RGB color signal to the color gamut 500 of the MPD is used.

Aspects of the present invention propose a method and apparatus for converting existing RGB data into color data that is suitable for the MPD. First, three-dimensional color coordinate values of an input image are measured or calculated. The three-dimensional color coordinate values of the input image are target color coordinate values (or target XYZ values). Then, output data for generating a color coordinate value that is most similar to each target color coordinate value is obtained.

That is, an input color can be converted into an output color by optimally minimizing a distance difference in a three-dimensional color space. This is because an MPD can generate at least one primary combination to obtain a three-dimensional color coordinate value. At this time, it is possible to reproduce a color that is most similar to a color corresponding to input data by an optimization whereby a color combination whose color, brightness, and chroma are most similar to those of the target color coordinate value is selected.

The optimization can be expressed by the following Equation 1:

$$\min\|f(x)-f_d\|$$

$$\text{subject to } x_{lb}\leqq x\leqq x_{ub}, |h(x)-h_d|\leqq\epsilon_h, \quad (1)$$

where x represents a multi-primary combination value (an analog value from 0 to 1 or a digital value from 0 to 255), f represents a function for converting x into a value in a three-dimensional color space (for example, an XYZ space, a CIELAB space, etc.), $f_d$ represents a value corresponding to a target color coordinate value in a space mapped by the function f, $x_{lb}$ and $x_{ub}$ respectively represent the lower and upper bound values of x, h represents a function for obtaining a hue value, $h_d$ represents a hue value of the target color coordinate value, and $\epsilon_d$ represents an allowable limit of a hue error.

By using the optimization expressed by Equation 1, it is possible to obtain a multi-primary combination value whose color is in an allowable error range and from which a color difference from the target color coordinate value is minimized, in a space having upper and lower ends that are bound.

However, converting the image data in real time when actual image data is processed can be difficult if optimization is to be performed whenever a color value of a node is converted into a multi-primary combination value. In order to overcome this problem, linear interpolation for each period using an LUT can be used for conversion between two color spaces having different primary sets. In this case, if multi-primary combination values for points corresponding to nodes of the LUT are obtained in advance, values between the nodes can be determined by performing linear interpolation on the multi-primary combination values. Accordingly, multi-primary combination values may be obtained in advance by applying the optimization to all predetermined nodes.

Figure 2:
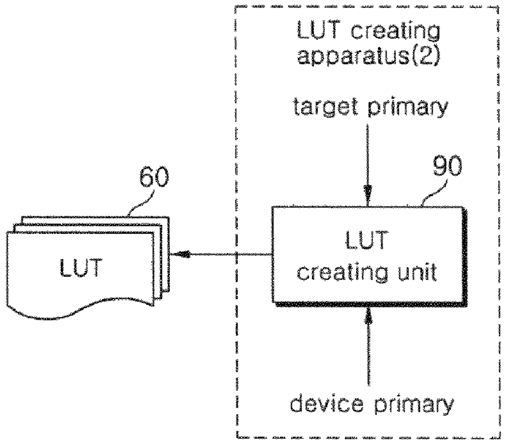
FIG. 2 illustrates a look-up table creating apparatus for color conversion, according to an example embodiment of the present invention.

FIG. 2 illustrates an LUT creating apparatus 2 for color conversion, according to an example embodiment of the present invention. Referring to FIG. 2, an LUT creating unit 90 of the LUT creating apparatus 2 creates a plurality of LUTs 60 for converting target primaries into the corresponding display's primaries. The LUTs 60 are stored in a storage unit (not shown), and used by a color conversion apparatus 1 (illustrated in FIG. 3). The LUT creating apparatus 2 may be included in the display together with the color conversion apparatus 1, or may be separate from the display.

The LUTs 60 are tables in which values are mapped to convert input colors to output colors using optimization (as described above) to minimize a distance difference in a three-dimensional color space. Each LUT 60 may be optimized in such a manner that a hue difference between an input color and an output color is in a predetermined allowable range. The three-dimensional color space may be an XYZ color space or a CIELAB color space.

Meanwhile, multi-primary combinations are used to expand a color gamut that can be reproduced by a display and/or implements a brighter display. However, when a primary with high brightness is added in order to implement a brighter display, there is a high probability that the added primary will have low chroma. This is because a dark color filter is used to implement a primary with high chroma, but the dark color filter cannot have a high brightness.

A representative example of a bright display capable of generating multi-primary combinations is an RGBW display to which a white color is added as a primary. The RGBW display has enhanced brightness, but also has a diminished chroma.

For example, in the case of color data having R, G, and B primaries, if a white color is added to the color data, brightness increases and chroma decreases. Due to the addition of the white color, the sizes of areas occupied by the R, G, and B primaries decrease, so that brightness decreases. Also, due to the addition of the white color, in the case of a high chroma region with a low chroma and high brightness background, the high chroma region appears to have a lower chroma due to an increase in the brightness difference.

In order to compensate for the visual effect, according to aspects of the present invention, a chroma component of an input image is analyzed. If the analysis determines that the input image has a large high chroma region, less white color is applied to the image and the brightness of the image is compensated for (for example, by increasing the number of backlights of an LCD). If the analysis determines that the input image has a large low chroma region, more white color is applied to the image to represent a degree of brightness of the image without increasing the brightness of the image. In order to implement the method, a transformation parameter $\alpha$ is defined according to the analysis of the input image, and LUTs are interpolated using the transformation parameter $\alpha$. Thus, the brightness of the image is increased using the interpolated LUT.

Hereinafter, for convenience of description, a case using two types of LUTs will be described as an example. However, it is understood that aspects of the present invention are not limited thereto. According to other aspects, a plurality of types of look-up tables can be used.

A first LUT is a color matching LUT used to reproduce colors that are most similar to those of a target display device. A second LUT is a full mapping LUT used to reproduce the entire color gamut of an MPD.

The first LUT may be created by performing color conversion on each node of a target RGB LUT using the above-described optimization method to obtain a multi-primary combination value.

The second LUT may be created by obtaining corresponding points using the method applied to the first LUT if at least one of the R, G, and B values of each node of the target RGB LUT is 0. Conversely, if none of the R, G, and B values of each node of the target RGB LUT are 0, a target color coordinate (a target XYZ coordinate) is set as a point having the same color coordinate as that of each node and being r times the brightness of the corresponding node, and applying the above-described optimization method.

For example, if $\gamma=1+(32/255)^{2.2}$ in the case of a point whose color coordinate (R, G, B) is (255,32,32), a multi-primary combination that is most similar to a point $\gamma$ times brighter than a target color coordinate corresponding to the point can be obtained as a corresponding point. Points corresponding to unmixed colors in the second LUT constructed above are the same as those in the first LUT. However, points with chroma values that are not maximum in the second LUT have brightness values higher than those in the first LUT.

Hereinafter, a color conversion apparatus of an MPD according to an example embodiment of the present invention will be described in connection with FIG. 3. The color conversion apparatus performs color conversion on the basis of an LUT that has been interpolated using a plurality of LUTs. In detail, the color conversion apparatus interpolates a plurality of predetermined LUTs to calculate an LUT suitable for an input image, and converts image data of the image on the basis of the LUT, thereby adjusting the brightness of the image.

Figure 3:
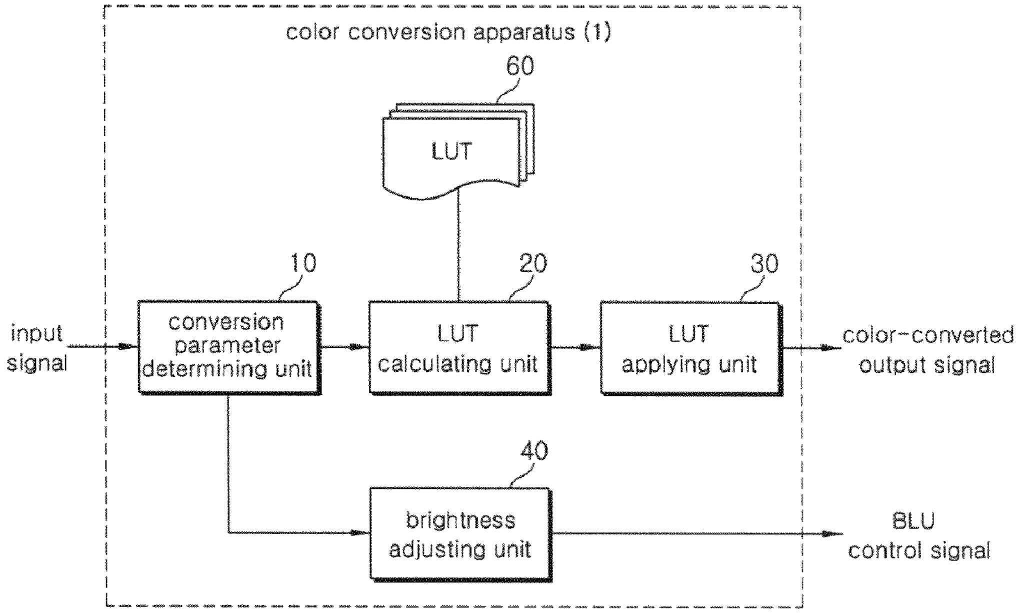
FIG. 3 is a block diagram of a color conversion apparatus of an MPD, according to an example embodiment of the present invention.

Referring to FIG. 3, the color conversion apparatus 1 includes a parameter determining unit 10, an LUT calculating unit 20, an LUT applying unit 30, and a brightness adjusting unit 40.

The parameter determining unit 10 analyzes an input image input to the MPD and determines a transformation parameter accordingly. That is, the parameter determining unit 10 analyzes the chroma of an input image to obtain a ratio of a high chroma region with respect to the input image or a ratio of a low chroma region with respect to the input image. Then, the parameter determining unit 10 determines a transformation parameter $\alpha$, which is a coefficient for interpolating a plurality of LUTs according to the ratio of the high chroma region or the ratio of the low chroma region.

If a major portion of the input image is a high chroma region, a use ratio of the first LUT increases. Conversely, if the major portion of the input image is a low chroma region, a use ratio of the second LUT increases. This is aimed at providing good color reproduction while maintaining advantages of the MPD. Accordingly, the transformation parameter is used as a coefficient for changing an application ratio of an LUT used for color conversion, according to the chroma of an input image.

A method of determining the transformation parameter may use a chroma histogram. If a chroma value corresponding to the upper n % of the chroma histogram is $C_{100}(n)$, $\alpha=f_{\alpha}(C_{100}(n))$, wherein $f_{\alpha}$ is a function value that is 0 if $C_{100}(n)$ is 0, and $f_{\alpha}$ is 1 if $C_{100}(n)$ is a maximum chroma value.

The LUT calculating unit 20 interpolates a plurality of LUTs for color conversion according to the transformation parameter that is determined by the parameter determining unit 10, in order to calculate an LUT that is suitable for the input image. The LUTs 60 include a first LUT that is provided to reproduce colors most similar to those of a target RGB display, and a second LUT that is provided to reproduce the entire color gamut of the MPD.

The LUT calculating unit 20 interpolates the first and second LUTs according to the transformation parameter. Specifically, the LUT calculating unit 20 interpolates the LUTs in such a manner that more of the first LUT is applied to an image in which a ratio of a high chroma region is relatively high, and more of the second LUT is applied to an image in which a ratio of a low chroma region is relatively high, thus calculating an LUT that is suitable for the input image. However, it is understood that aspects of the present invention are not limited to using the two LUTs. According to other aspects an LUT suitable for the input image can be calculated by interpolating a plurality of LUTs.

That is, the LUT calculating unit 20 interpolates two or more LUTs on the basis of the transformation parameter $\alpha$, and calculates an LUT that is suitable for the input image accordingly. Values from 0 to 1 are respectively assigned to nodes from to $\beta_0$ to $\beta_n$ of the first and second LUTs. If $\beta_0 \leqq 1-\alpha \leqq \beta_n$, the LUT suitable for the input image is calculated by linearly combining two LUT values ($\beta_n-1+\alpha:1-\alpha-\beta_{n-1}$) corresponding to nodes $\beta_{n-1}$ and $\beta_n$. In the case where interpolation is performed using two LUTs, if $\beta$ values of the LUTs are 0 and 1, the second LUT is calculated if $\alpha=0$, which corresponds to a linear combination of (0:1). Conversely, the first LUT is calculated if $\alpha=1$, which corresponds to a linear combination of (1:0). If $0<\alpha<1$, an LUT suitable for the input image is calculated by linearly combining the two LUTs. This can be represented by Equation 2:

$$\text{If } \beta_{n-1} \leq 1-\alpha \leq \beta_n, \qquad (2)$$

$$LUT = [\beta_n - 1 + \alpha \;\; 1 - \alpha - \beta_{n-1}]\begin{bmatrix} LUT_{n-1} \\ LUT_n \end{bmatrix}$$

The LUT applying unit 30 applies the LUT to the input image, thereby performing color conversion. Accordingly, the colors of an existing RGB display can be reproduced by an MPD. That is, by performing color conversion using a transformation parameter based on chroma values of an input image in an MPD having color coordinates different from those of the input image, an efficient color conversion apparatus 10 according to aspects of the present invention provides good color reproduction and efficiently uses a color gamut of the MPD.

Meanwhile, in order to obtain advantages in chroma or brightness using an MPD, a maximum range that can be reproduced by the MPD is set as the range of a color conversion function.

However, using the above-described method in the MPD to increase brightness may deteriorate the chroma values of primaries. This is because an area assigned to each primary decreases and, as a result, brightness is reduced as the number of primaries increases. The reduction in brightness can be compensated for by adding a new primary (for example, white (W)). However, if brightness is compensated for by using an additional primary, there is a problem in that the chroma is reduced.

In order to resolve this problem, aspects of the present invention provide a method of maintaining brightness by increasing the lightness of an MPD while reproducing colors of an RGB display in the MPD using the above-described color conversion method. That is, by combining a plurality of mapping methods and properly increasing the brightness of a screen, it is possible to sufficiently reproduce colors of an image and obtain the advantages of an MPD, while maintaining the original brightness ratio of the image.

In order to maintain the brightness, the brightness adjusting unit 40 adjusts the brightness of the image on the basis of the transformation parameter. That is, the brightness adjusting unit 40 adjusts the brightness of the image in such a manner as to increase the brightness of the image relatively more using the transformation parameter when the interpolated LUT is similar to the first LUT, and to increase the brightness of the image relatively less using the transformation parameter when the interpolated LUT is similar to the second LUT.

When a maximum increase amount of brightness is $I_{max}$, an increase amount of brightness suitable for the input image can be defined to $I_{max} \cdot I(\alpha)$. Accordingly, it is possible to obtain advantages of an MPD while maintaining the original brightness ratio of an image and sufficiently reproducing colors of the image.

Figure 4:
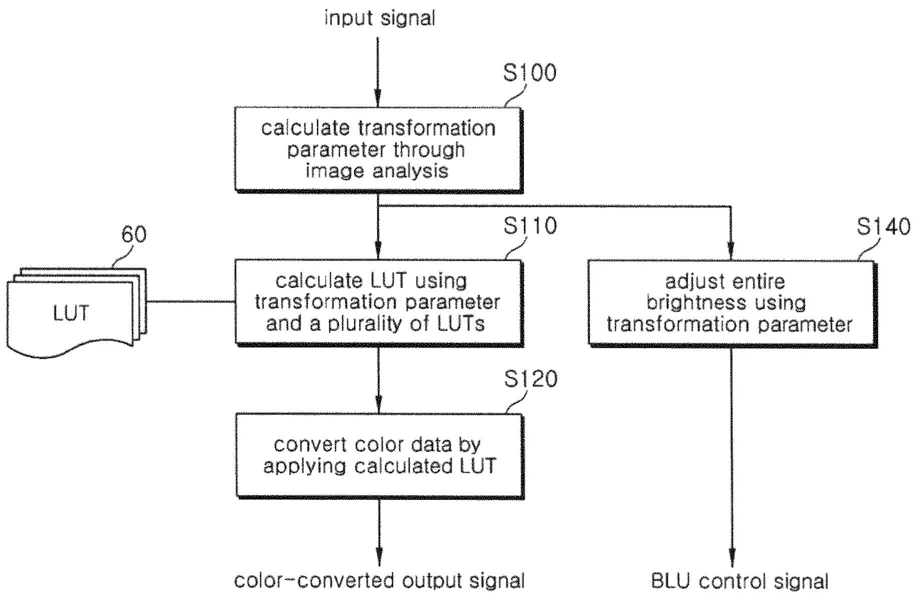
FIG. 4 is a flowchart of a color conversion method according to an example embodiment of the present invention.

Hereinafter, a color conversion method according to an example embodiment of the present invention will be described with reference to FIG. 4. FIG. 4 is a flowchart of a color conversion method according to an example embodiment of the present invention.

Referring to FIG. 4, in order to perform color conversion in an MPD, an input image is analyzed to determine a transformation parameter in operation S100. At this point, the chroma of the input image is analyzed to obtain a ratio of a high chroma region with respect to the input image or a ratio of a low chroma region with respect to the input image. Furthermore, a transformation parameter for interpolating two or more LUTs is determined on the basis of the ratio of the high chroma region or the ratio of the low chroma region.

Then, the LUTs for color conversion are interpolated on the basis of the transformation parameter, and a LUT suitable for the input image is obtained in operation S110. The LUTs include a first LUT that is configured to reproduce colors most similar to those of a target display, and a second LUT that is configured to reproduce the entire color gamut of an MPD. The LUT calculating unit 20 (see FIG. 3) obtains an LUT suitable for the input image by interpolating the LUTs in such a manner as to apply more of the first LUT to the image if a ratio of a high chroma region is relatively high, and to apply more of the second LUT if a ratio of a low chroma region is relatively high, on the basis of the transformation parameter. Then, by applying the obtained LUT to the input image, color conversion is performed in operation S120.

Meanwhile, the brightness of the input image is adjusted on the basis of the transformation parameter in operation S130. The brightness adjusting unit 40 (illustrated in FIG. 3) may increase the brightness of the image relatively more using the transformation parameter if the obtained LUT is similar to the first LUT, and may increase the brightness of the image relatively less using the transformation parameter if the obtained LUT is similar to the second LUT.

Figure 5:
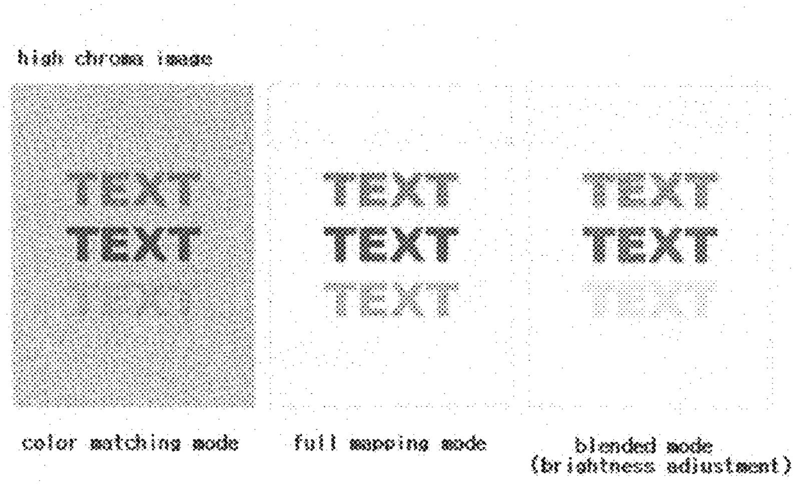
FIGS. 5, 6, and 7 are views showing effects when the color conversion method as illustrated in FIG. 4 is applied to high chroma, non-chroma, and low chroma images.
Figure 6:
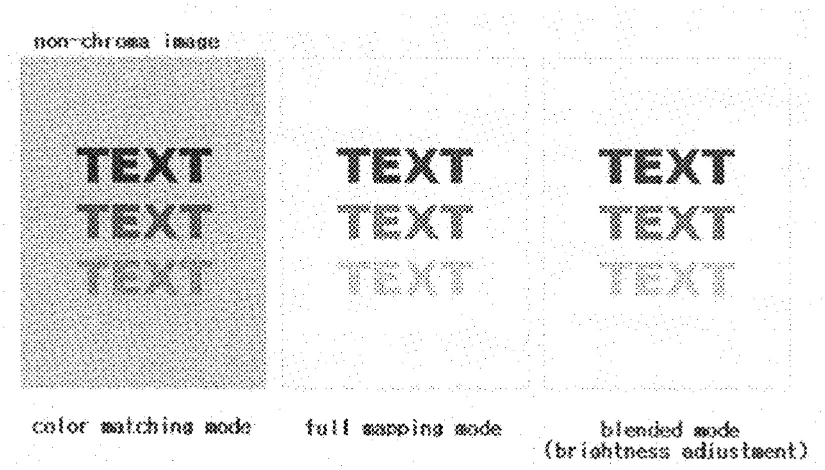
Figure 7:
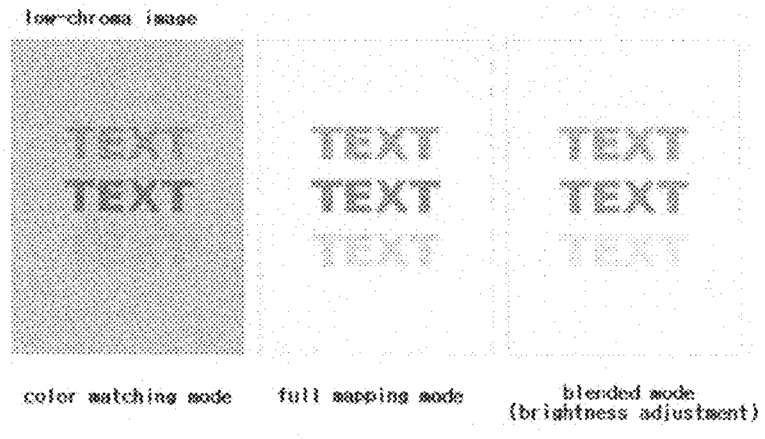

FIGS. 5, 6, and 7 are views to explain effects when the color conversion method illustrated in FIG. 4 is applied to high chroma, non-chroma, and low chroma images. Specifically, FIGS. 5, 6, and 7 illustrate results of color conversion obtained when the first LUT (a color matching LUT) is applied to high chroma, non-chroma, and low chroma images, results of color conversion obtained when the second LUT (a full mapping LUT) is applied to the high chroma, non-chroma, and low chroma images, and results of color conversion obtained when an interpolated LUT of the first and second LUTs is applied to the high chroma, non-chroma, and low chroma images using a transformation parameter, respectively. That is, FIG. 5 relates to the high chroma image, FIG. 6 relates to the non-chroma image, and FIG. 7 relates to the low chroma image.

Results of color conversion obtained when the first LUT, the second LUT, and the interpolated LUT are applied to a high chroma image are illustrated in FIG. 5. In the case of a high chroma image, if the first LUT is applied, the color conversion results in low brightness. If the second LUT is applied to the high chroma image, the color conversion results in low brightness only in primary parts. In order to compensate for the low brightness, in it is possible to enhance the brightness and chroma of the high chroma image by applying the first LUT to perform color conversion, and then increasing the brightness of the high chroma image.

Next, results of color conversion of a non-chroma image obtained when the first LUT, the second LUT, and the interpolated LUT are applied to a non-chroma image are illustrated in FIG. 6. In the case of a non-chroma image, if the first LUT is applied, the color conversion (a color matching mode) results in low brightness. If the second LUT is applied to the non-chroma image, the color conversion (a full mapping mode) results in high brightness. Accordingly, in the case of the non-chroma image, since no visual loss occurs due to chroma deterioration in any part of the non-chroma image, the result of color conversion (the full mapping mode) obtained when the second LUT is applied can be used without any modification.

Finally, results of color conversion of a low chroma image obtained when the first LUT, the second LUT, and the integrated LUT are applied to the low chroma image are illustrated in FIG. 7. In the case of a low chroma image, if the first LUT is applied, the color conversion (a color matching mode) results in low brightness. If the second LUT is applied to the low chroma image, the color conversion (a full mapping mode) results in visual loss by which a certain region having chroma is seen as if it has chroma lower than the real chroma. In order to compensate for the deterioration in chroma, it is possible to improve the brightness and chroma of the low chroma image by properly interpolating two LUTs, performing color conversion using the interpolated LUT, and increasing the brightness of the low chroma image according to the degree of interpolation.

As described above, according to aspects of the present invention, it is possible to efficiently reproduce an original image in an MPD having color coordinates that are different from those of primaries of an input image. That is, it is possible to reproduce colors similar to original colors by performing color conversion using a method (a color matching mode) of applying a first LUT based on a three-dimensional color coordinate. Also, it is possible to maintain advantages of an MPD by performing color conversion using a method (a full mapping mode) of applying a second LUT. Furthermore, by interpolating the color matching mode and the full mapping mode using a transformation parameter based on a chroma value of an input image, it is possible to compensate for the low brightness of the color matching mode and the low chroma of the full mapping mode, thus efficiently enhancing the brightness and chroma of the input image. Also, by adaptively adjusting the brightness of an image on the basis of a transformation parameter, it is possible to effectively represent the brightnesses and chromas of high chroma, non-chroma, and low chroma images.

Various components of the color conversion apparatus, shown in FIG. 3, such as the parameter determining unit 10, the LUT calculating unit 20 and the LUT applying unit 30 can also be integrated into a single control unit, or alternatively, can be implemented in software or hardware, such as, for example, a field programmable gate array (FPGA) or an application specific integrated circuit (ASIC). As such, it is intended that the processes described herein be broadly interpreted as being equivalently performed by software, hardware, or a combination thereof. As previously discussed, software modules can be written, via a variety of software languages, including C, C++, Java, Visual Basic, and many others. These software modules may include data and instructions which can also be stored on one or more machine-readable storage media, such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; and optical media such as compact discs (CDs) or digital video discs (DVDs). Instructions of the software routines or modules may also be loaded or transported into the wireless cards or any computing devices on the wireless network in one of many different ways. For example, code segments including instructions stored on floppy discs, CD or DVD media, a hard disk, or transported through a network interface card, modem, or other interface device may be loaded into the system and executed as corresponding software routines or modules. In the loading or transport process, data signals that are embodied as carrier waves (transmitted over telephone lines, network lines, wireless links, cables, and the like) may communicate the code segments, including instructions, to the network node or element. Such carrier waves may be in the form of electrical, optical, acoustical, electromagnetic, or other types of signals.

In addition, the present invention can also be embodied as computer readable codes on a computer readable recording medium. The computer readable recording medium is any data storage device that can store data which can be thereafter read by a computer system. Examples of the computer readable recording medium also include read-only memory (ROM), random-access memory (RAM), CD-ROMs, magnetic tapes, floppy disks, optical data storage devices, and data transmission through the Internet. The computer readable recording medium can also be distributed over network coupled computer systems so that the computer readable code is stored and executed in a distributed fashion. Also, functional programs, codes, and code segments for accomplishing the present invention can be easily construed by programmers skilled in the art to which the present invention pertains.

While there have been illustrated and described what are considered to be example embodiments of the present invention, it will be understood by those skilled in the art and as technology develops that various changes and modifications, may be made, and equivalents may be substituted for elements thereof without departing from the true scope of the present invention. Many modifications, permutations, additions and sub-combinations may be made to adapt the teachings of the present invention to a particular situation without departing from the scope thereof. Accordingly, it is intended, therefore, that the present invention not be limited to the various example embodiments disclosed, but that the present invention includes all embodiments falling within the scope of the appended claims.

What is claimed is:

1. A color conversion method for a display, comprising:

analyzing an input image to determine a transformation parameter based upon an analysis of a chroma component of the input image;

interpolating, using at least one processing device, at least two color space conversion look-up tables according to the transformation parameter, so as to calculate a look-up table for the input image; and applying the calculated look-up table to the input image to perform the color conversion, wherein the at least two color space conversion look-up tables are created in advance to convert an input color into an output color by minimizing a distance difference in a color space and to have predefined limits in hue.

2. A color conversion method for a display, comprising:

analyzing an input image to determine a transformation parameter;

interpolating, using at least one processing device, at least two look-up tables for color conversion according to the transformation parameter, so as to calculate a look-up table for the input image; and applying the calculated look-up table to the input image to perform the color conversion, wherein the analyzing of the input image comprises:

analyzing a chroma component of the input image to obtain a ratio of a high chroma region with respect to the input image and/or a ratio of a low chroma region with respect to the input image; and calculating the transformation parameter for interpolating the at least two look-up tables according to the ratio of the high chroma region and/or the ratio of the low chroma region.

3. The color conversion method as claimed in claim 2, wherein:

the at least two look-up tables comprise a first look-up table configured to reproduce colors most similar to colors that are capable of being reproduced by a target display, and a second look-up table configured to reproduce an entire color gamut that is capable of being reproduced by a multi-primary display; and the interpolating of the at least two look-up tables comprises:

interpolating the at least two look-up tables according to the transformation parameter such that a use ratio of the first look-up table for the input image increases if a ratio of a high chroma region of the input image is greater than a predetermined amount; and interpolating the at least two look-up tables according to the transformation parameter such that a use ratio of the second look-up table for the input image increases if a ratio of a low chroma region of the input image is greater than a predetermined amount.

4. The color conversion method as claimed in claim 3, further comprising:

adjusting a brightness of the input image according to the transformation parameter.

5. The color conversion method as claimed in claim 4, wherein the adjusting of the brightness of the input image comprises:

increasing the brightness of the input image by a first predetermined amount using the transformation parameter when the calculated look-up table is similar to the first look-up table; and increasing the brightness of the input image by a second predetermined amount, less than the first predetermined amount, using the transformation parameter when the calculated look-up table is similar to the second look-up table.

6. A color conversion apparatus for a display, the color conversion apparatus comprising:

a parameter determining unit to analyze an input image, and to determine a transformation parameter according to the analysis based upon an analysis of a chroma component of the input image;

a look-up table calculating unit to interpolate at least two color space conversion look-up tables according to the transformation parameter, so as to calculate a look-up table for the input image; and a look-up table applying unit to apply the calculated look-up table to the input image so as to perform the color conversion, wherein the at least two color space conversion look-up tables are created in advance to convert an input color into an output color by minimizing a distance difference in a color space and to have predefined limits in hue.

7. A color conversion apparatus for a display, the color conversion apparatus comprising:

a parameter determining unit to analyze an input image, and to determine a transformation parameter according to the analysis;

a look-up table calculating unit to interpolate at least two look-up tables for color conversion according to the transformation parameter, so as to calculate a look-up table for the input image; and a look-up table applying unit to apply the calculated look-up table to the input image so as to perform the color conversion, wherein the parameter determining unit:

analyzes a chroma component of the input image to obtain a ratio of a high chroma region with respect to the input image and/or a ratio of a low chroma region with respect to the input image; and calculates the transformation parameter for interpolating the at least two look-up tables according to the ratio of the high chroma region and/or the ratio of the low chroma region.

8. The color conversion apparatus as claimed in claim 7, wherein:

the at least two look-up tables comprise a first look-up table configured to reproduce colors most similar to colors that are capable of being reproduced by a target display, and a second look-up table configured to reproduce an entire color gamut that is capable of being reproduced by a multi-primary display; and the look-up table calculating unit:

interpolates the at least two look-up tables according to the transformation parameter such as to increase a use ratio of the first look-up table for the input image if a ratio of a high chroma region is greater than a predetermined amount; and interpolates the at least two look-up tables according to the transformation parameter such as to increase a use ratio of the second look-up table for the input image if a ratio of a low chroma region is greater than a predetermined amount.

9. The color conversion apparatus as claimed in claim 8, further comprising a brightness adjusting unit to adjust a brightness of the input image according to the transformation parameter.

10. The color conversion apparatus as claimed in claim 9, wherein the brightness adjusting unit increases the brightness of the input image by a first predetermined amount using the transformation parameter if the calculated look-up table is similar to the first look-up table, and increases the brightness of the input image by a second predetermined amount, less than the first predetermined amount, using the transformation parameter if the calculated look-up table is similar to the second look-up table.

11. A color conversion apparatus for a display, the color conversion apparatus comprising:

a parameter determining unit to analyze an input image, and to determine a transformation parameter according to the analysis;

a look-up table calculating unit to interpolate at least two look-up tables for color conversion according to the transformation parameter, so as to calculate a look-up table for the input image; and a look-up table applying unit to apply the calculated look-up table to the input image so as to perform the color conversion, wherein the at least two look-up tables are created in advance to convert an input color into an output color by minimizing a distance difference in a three-dimensional color space.

12. The color conversion apparatus as claimed in claim 11, wherein the three-dimensional color space is an XYZ color space or a CIELAB color space.

13. The color conversion apparatus as claimed in claim 11, wherein the at least two look-up tables are optimized so that a hue difference between the input color and the output color is in a predetermined allowable range.

14. The color conversion method as claimed in claim 1, wherein the analyzing of the input image comprises:

analyzing the chroma component of the input image to obtain a ratio of a high chroma region with respect to the input image and/or a ratio of a low chroma region with respect to the input image; and calculating the transformation parameter for interpolating the at least two look-up tables according to the ratio of the high chroma region and/or the ratio of the low chroma region.

15. The color conversion method as claimed in claim 14, wherein:

the at least two look-up tables comprise a first look-up table configured to reproduce colors most similar to colors that are capable of being reproduced by a target display, and a second look-up table configured to reproduce an entire color gamut that is capable of being reproduced by a multi-primary display; and the interpolating of the at least two look-up tables comprises:

interpolating the at least two look-up tables according to the transformation parameter such that a use ratio of the first look-up table for the input image increases if a ratio of a high chroma region of the input image is greater than a predetermined amount; and interpolating the at least two look-up tables according to the transformation parameter such that a use ratio of the second look-up table for the input image increases if a ratio of a low chroma region of the input image is greater than a predetermined amount.

16. The color conversion method as claimed in claim 15, further comprising:

adjusting a brightness of the input image according to the transformation parameter.

17. The color conversion method as claimed in claim 16, wherein the adjusting of the brightness of the input image comprises:

increasing the brightness of the input image by a first predetermined amount using the transformation parameter when the calculated look-up table is similar to the first look-up table; and increasing the brightness of the input image by a second predetermined amount, less than the first predetermined amount, using the transformation parameter when the calculated look-up table is similar to the second look-up table.

18. The color conversion apparatus as claimed in claim 6, wherein the parameter determining unit:

analyzes the chroma component of the input image to obtain a ratio of a high chroma region with respect to the input image and/or a ratio of a low chroma region with respect to the input image; and calculates the transformation parameter for interpolating the at least two look-up tables according to the ratio of the high chroma region and/or the ratio of the low chroma region.

19. The color conversion apparatus as claimed in claim 18, wherein:

the at least two look-up tables comprise a first look-up table configured to reproduce colors most similar to colors that are capable of being reproduced by a target display, and a second look-up table configured to reproduce an entire color gamut that is capable of being reproduced by a multi-primary display; and the look-up table calculating unit:

interpolates the at least two look-up tables according to the transformation parameter such as to increase a use ratio of the first look-up table for the input image if a ratio of a high chroma region is greater than a predetermined amount; and interpolates the at least two look-up tables according to the transformation parameter such as to increase a use ratio of the second look-up table for the input image if a ratio of a low chroma region is greater than a predetermined amount.

20. The color conversion apparatus as claimed in claim 19, further comprising a brightness adjusting unit to adjust a brightness of the input image according to the transformation parameter.

21. The color conversion apparatus as claimed in claim 20, wherein the brightness adjusting unit increases the brightness of the input image by a first predetermined amount using the transformation parameter if the calculated look-up table is similar to the first look-up table, and increases the brightness of the input image by a second predetermined amount, less than the first predetermined amount, using the transformation parameter if the calculated look-up table is similar to the second look-up table.

22. The color conversion apparatus as claimed in claim 6, wherein the at least two look-up tables are created in advance to convert an input color into an output color by minimizing a distance difference in a three-dimensional color space.

23. The color conversion apparatus as claimed in claim 22, wherein the three-dimensional color space is an XYZ color space or a CIELAB color space.

24. A color conversion apparatus for a display, the color conversion apparatus comprising:

a parameter determining unit to analyze an input image, and to determine a transformation parameter according to the analysis based upon an analysis of a chroma component of the input image;

a look-up table calculating unit to interpolate at least two color space conversion look-up tables according to the transformation parameter, so as to calculate a look-up table for the input image; and a look-up table applying unit to apply the calculated look-up table to the input image so as to perform the color conversion, wherein the at least two look-up tables are created in advance to convert an input color into an output color by minimizing a distance difference in a color space, and, wherein the at least two look-up tables are optimized so that a hue difference between the input color and the output color is in a predetermined allowable range.

25. A color conversion method for a display, comprising:

analyzing an input image to determine a transformation parameter;

interpolating, using at least one processing device, at least two look-up tables for color conversion according to the transformation parameter, so as to calculate a look-up table for the input image; and applying the calculated look-up table to the input image to perform the color conversion, wherein the at least two look-up tables are created in advance to convert an input color into an output color by minimizing a distance difference in a three-dimensional color space.

26. The color conversion apparatus as claimed in claim 25, wherein the three-dimensional color space is an XYZ color space or a CIELAB color space.

27. The color conversion apparatus as claimed in claim 25, wherein the at least two look-up tables are optimized so that a hue difference between the input color and the output color is in a predetermined allowable range.

* * * * *